(12) United States Patent
Tsai et al.

(10) Patent No.: US 8,334,571 B2
(45) Date of Patent: Dec. 18, 2012

(54) JUNCTION VARACTOR FOR ESD PROTECTION OF RF CIRCUITS

(75) Inventors: Ming-Hsien Tsai, Sindian (TW); Tzu-Jin Yeh, Hsinchu (TW); Chewn-Pu Jou, Chutung (TW); Fu-Lung Hsueh, Cranbury, NJ (US)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 316 days.

(21) Appl. No.: 12/731,562

(22) Filed: Mar. 25, 2010

(65) Prior Publication Data

US 2011/0233678 A1 Sep. 29, 2011

(51) Int. Cl.
*H01L 23/60* (2006.01)
*H01L 23/64* (2006.01)
*H01L 29/08* (2006.01)

(52) U.S. Cl. ................ 257/357; 257/595; 257/E27.073; 257/E23.141; 257/E29.344

(58) Field of Classification Search .................. None
See application file for complete search history.

(56) References Cited

U.S. PATENT DOCUMENTS

| | | | | |
|---|---|---|---|---|
| 3,657,609 A * | 4/1972 | Oswald et al. | ............... | 257/601 |
| 6,891,207 B2 * | 5/2005 | Pequignot et al. | ............ | 257/173 |
| 7,119,401 B2 * | 10/2006 | Voldman | ........................ | 257/362 |
| 7,348,657 B2 * | 3/2008 | Pequignot et al. | ............ | 257/546 |
| 8,039,868 B2 * | 10/2011 | Gauthier et al. | ............... | 257/173 |
| 2002/0130390 A1 * | 9/2002 | Ker et al. | ....................... | 257/546 |
| 2008/0203537 A1 * | 8/2008 | Anderson et al. | ............. | 257/601 |

OTHER PUBLICATIONS

Ker, Ming-Dou, and Yuan-Wen Hsiao. "ESD Protection Design With Low-Capacitance Consideration for High-Speed/High-Frequency I/O Interfaces in Integrated Circuits." Recent Patents on Engineering 1.2 (2007): 131-45.*
Linten, D.; Thijs, S.; Natarajan, M.I.; Wambacq, P.; Jeamsaksiri, W.; Ramos, J.; Mercha, A.; Jenei, S.; Donnay, S.; Decoutere, S.; , "A 5-GHz fully integrated ESD-protected low-noise amplifier in 90-nm RF CMOS," Solid-State Circuits, IEEE Journal of, vol. 40, No. 7, pp. 1434- 1442, Jul. 2005.*
Hsiao, Yuan-Wen, and Ming-Dou Ker. "A 5-GHz Differential Low-Noise Amplifier With High Pin-to-Pin ESD Robustness in a 130-nm CMOS Process." IEEE Transactions on Microwave Theory and Techniques 57.5 (2009): 1044-053.*

(Continued)

*Primary Examiner* — Victor A Mandala
*Assistant Examiner* — Joseph Schoenholtz
(74) *Attorney, Agent, or Firm* — Duane Morris LLP

(57) ABSTRACT

An ESD protection device includes a first well of a first semiconductor type disposed in a substrate of a second semiconductor type forming a first diode. A second well of the second semiconductor type is formed in the substrate to form a second diode with the first well. A first plurality of doped regions of the first semiconductor type are formed in an upper surface of the first well. A second plurality of doped regions of the second semiconductor type are formed in the upper surface of the first well forming a third diode with the first well. A plurality of STI regions are formed in the upper surface of the first well. Each STI region is disposed between a doped region of the first and second semiconductor types. The third diode provides a current bypass when an ESD voltage spike is received at one of the first or second plurality of doped regions.

20 Claims, 6 Drawing Sheets

OTHER PUBLICATIONS

Lin, Chun-Yu, Ming-Dou Ker, and Yuan-Wen Hsiao. "Design of Differential Low-noise Amplifier with Cross-coupled-SCR ESD Protection Scheme." Microelectronics Reliability 50.6 (2010): 831-38.*

Ming-Hsien Tsai; Hsu, S.S.H.; Fu-Lung Hsueh; Chewn-Pu Jou; , "ESD-Protected K-Band Low-Noise Amplifiers Using RF Junction Varactors in 65-nm CMOS," Microwave Theory and Techniques, IEEE Transactions on , vol. 59, No. 12, pp. 3455-3462, Dec. 2011.*

Li Junjun, et. al.,Capacitance Investigation of Diodes and SCRs for ESD Protection of High Frequency Circuits in Sub-100nm Bulk CMOS TechnologiesElectrical Overstress/Electrostatic Discharge Symposium, 2007. EOS/ESD 2007, pp. 4A.2-1-4A.2.1-7, 2007.*

Lin, Chun-Yu et.al., "ESD Protection Design for Differential Low-Noise Amplified Amplifier With Cross-Coupled SCR." IEEE ICIDT-10 (2010).*

Tsai, M.H. et al. "A Low Noise Amplifier Co-designed with ESD Protection Circuit in 65-nm CMOS", Microwave Symposium Digest, 2009, MTT '09, IEEE-MTT-S International, pp. 573-576.

Kleveland, B. et al., "Distributed ESD Protection for High-Speed Integrated Circuits", IEEE Electron Device Letters, Aug. 2008, 21(8):390-392.

Chen, G. et al., "Characterizing Diodes for RF ESD Protection", IEEE Electron Device Letters, May 2004, 25(5):323-325.

Gau, J.H. et al., "Gate-Assisted High-Q-Factor Junction Varactor", IEEE Electron Device Letters, Sep. 2005, 26(9):682-683.

Chan, Y.J. et al., "Performance Consideration of MOS and Junction Diodes for Varactor Application", IEEE Transactions on Electron Devices, Sep. 2007, 54(9):2570-2573.

Xie, H. et al., "A New Low-Parasitic Polysilicon SCR ESD Protection Structure for RF ICs", IEEE Electron Device Letters, Feb. 2005, 26(2):121-123.

* cited by examiner

JUNCTION VARACTOR FOR ESD PROTECTION OF RF CIRCUITS

FIELD OF DISCLOSURE

The disclosed system and method relate to integrated circuits. More specifically, the disclosed system and method relate to electrostatic discharge (ESD) protection for radio frequency (RF) integrated circuits.

BACKGROUND

With the continued miniaturization of integrated circuit (IC) devices, the current trend is to produce integrated circuits having shallower junction depths, thinner gate oxides, lightly-doped drain (LDD) structures, shallow trench isolation (STI) structures, and self-aligned silicide (salicide) processes, all of which are used in advanced sub-quarter-micron complementary metal oxide semiconductor (CMOS) technologies. All of these processes cause the related CMOS IC products to become more susceptible to damage due to ESD events. Therefore, ESD protection circuits are built onto the chip to protect the devices and circuits on the IC from ESD damage. ESD protection is especially challenging for RF ICs in view of the reduced gate oxide thicknesses and lowered breakdown voltages in the devices of the RF ICs.

FIG. 1 illustrates one example of a conventional ESD protection device 100 including a gate grounded NMOS (GGNMOS) transistor 102 having its source also coupled to ground and its drain coupled to a node 108 between a pad 106 and a resistor 104. FIG. 2 illustrates a distributed ESD protection arrangement 200 including a plurality of GGNMOS transistors 202-1:202-4 having their sources coupled to ground and their drains coupled to a respective PMOS transistor 204-1: 204-4 through an n-type well having a resistance R. Each of the PMOS transistors has its gate and source coupled to a positive supply voltage node $V_{DD}$. However, such an arrangement increases the device size and consequently contributes to a large parasitic capacitance.

FIG. 3A is a plan view of another example of an ESD protection arrangement 300, and FIG. 3B is a cross-sectional view of the ESD protection device 300, which is a single finger configuration shallow trench isolation (STI) diode. As shown in FIGS. 3A and 3B, the STI diode includes an n-type well (n-well) 304 formed over a p-type substrate 302. Two N+ regions 306-1, 306-2 are formed over n-well 304 and are laterally spaced from one another. A P+ region 308 is disposed between the N+ regions 306-1, 306-2. STI regions 310-1:310-4 are disposed adjacent to each of the N+ and P+ regions 306-1, 306-2, 308 over n-well 304. While the STI diode 300 provides low capacitance and a small area, its parasitic capacitance and resistance impact RF input matching, and its performance degrades for high frequency RF applications.

Accordingly, an improved ESD protection scheme is desirable.

SUMMARY

An electrostatic discharge (ESD) protection device is disclosed including a substrate of a first semiconductor type and a first well of a second semiconductor type formed in the substrate. A first plurality of laterally spaced doped regions of the first semiconductor type are formed in an upper surface of the first well. The first plurality of laterally spaced doped regions are coupled together to define an anode of the ESD protection device. A second plurality of laterally spaced doped regions of the second semiconductor type are formed in the upper surface of the first well and are coupled together to define a cathode of the ESD protection device. A plurality of shallow trench isolation (STI) regions are disposed in an upper surface of the first well. Each of the plurality of STI regions is disposed between a laterally spaced doped region of the first semiconductor type and a laterally spaced doped region of the second semiconductor type. A diode defined by the first well and the plurality of laterally spaced doped regions of the second type is configured to operate as a passive radio frequency capacitor when reverse biased and to be forward biased to provide a current bypass when an ESD voltage spike is received at one of the anode or the cathode.

Also disclosed is a radio frequency (RF) electrostatic discharge (ESD) protection device including a first well of a first semiconductor type formed in a substrate of a second semiconductor type. A second well of the second semiconductor type is formed in the substrate and surrounds the first well. A first plurality of doped regions of the second semiconductor type are formed in an upper surface of the first well and are coupled together to form an anode of the ESD protection device. A second plurality doped regions of the first semiconductor type are formed in the upper surface of the well and are coupled together to form a cathode of the ESD device. A plurality of shallow trench isolation (STI) regions are disposed in an upper surface of the first well. Each of the plurality of STI regions is disposed between one of the doped regions of the first semiconductor type and one of the doped regions of the second semiconductor type. The first well and the plurality of laterally spaced doped regions of the first semiconductor type form a first diode configured to operate as a passive radio frequency capacitor when reverse biased and to be forward biased to provide a current bypass when an ESD voltage spike is received at one of the anode or the cathode.

An electrostatic discharge (ESD) protection device for radio frequency circuits is also disclosed. A first well of a first semiconductor type is formed in a substrate of a second semiconductor type. The first well and the substrate form a first diode. A second well of the second semiconductor type is formed in the substrate adjacent to the first well and forms a second diode with the first well. A first plurality of doped regions of the first semiconductor type are formed in an upper surface of the first well, and a second plurality of doped regions of the second semiconductor type are formed in the upper surface of the first well to form a third diode with the first well. A plurality of shallow trench isolation (STI) regions are formed in the upper surface of the first well. Each of the STI regions is disposed between one of the doped regions of the first semiconductor type and one of the doped regions of the second semiconductor type. The third diode is configured to be forward biased to provide a current bypass when an ESD voltage spike is received at the first plurality of doped regions of the first semiconductor type or the second plurality of doped regions of the second semiconductor type.

DETAILED DESCRIPTION

An improved electrostatic discharge (ESD) protection device for radio frequency (RF) applications is disclosed. The ESD protection device includes a junction varactor configured as a voltage-dependent capacitor when reverse-biased. The bias voltage of the junction varactor may be optimized with a minimum capacitance to decrease the capacitance effect for network matching during normal RF operating conditions. During an ESD event, the junction varactor is forward biased and acts as an ESD protection diode to bypass ESD current. Additionally, the junction varactor provides a sufficient metal width and a sufficient number of vias and contacts to avoid electron migration while having a length-to-width (L/W) ratio that enables alignment with a bond pad edge for improved layout routing compared to conventional ESD protection devices.

Figure 1:
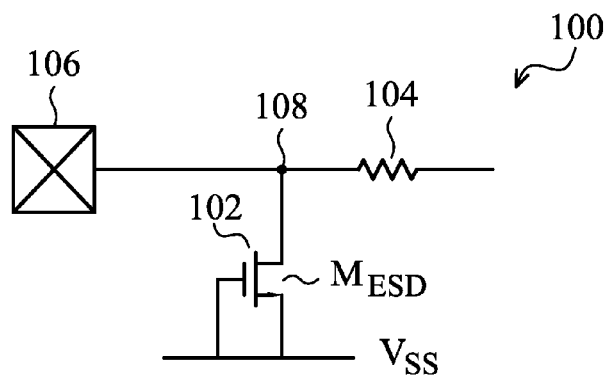
FIG. 1 is a conventional gate-grounded NMOS ESD protection device.
Figure 2:
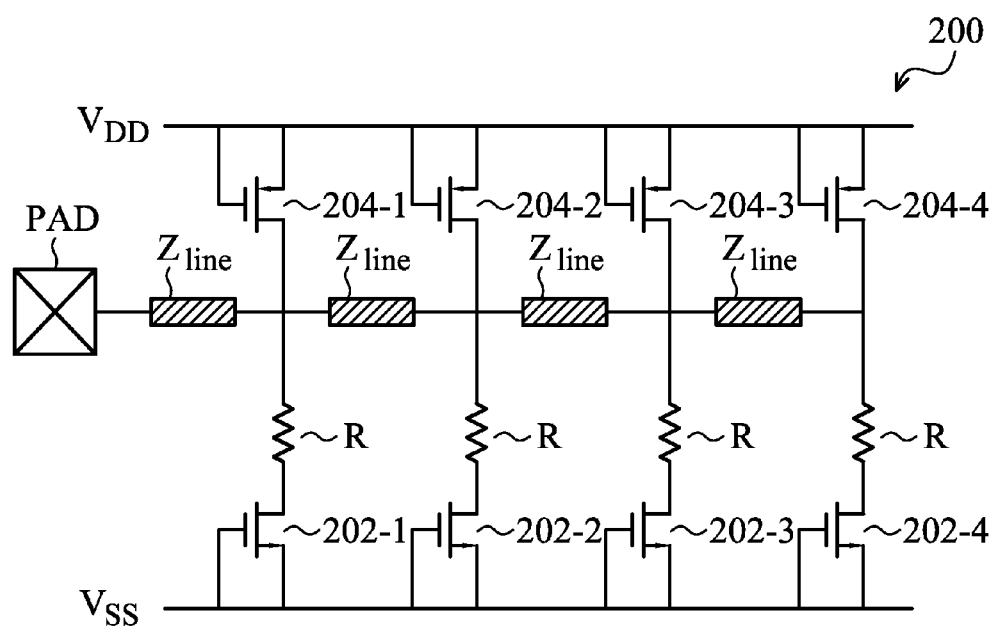
FIG. 2 is a conventional ESD protection device comprising an array of gate-grounded NMOS devices.
Figure 3A:
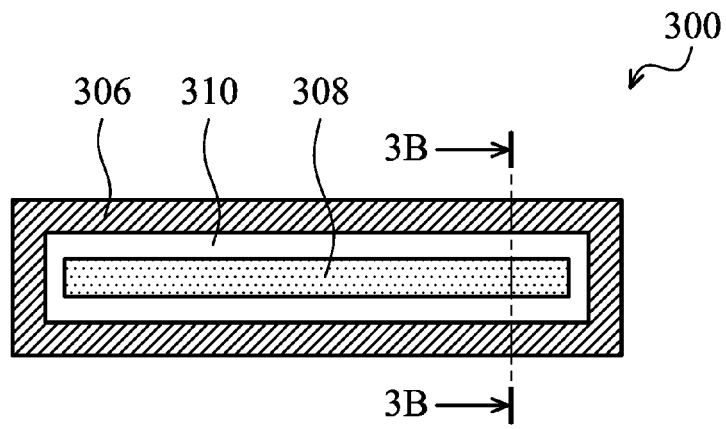
FIG. 3A is a plan view of a conventional ESD protection device comprising an STI diode.
Figure 3B:
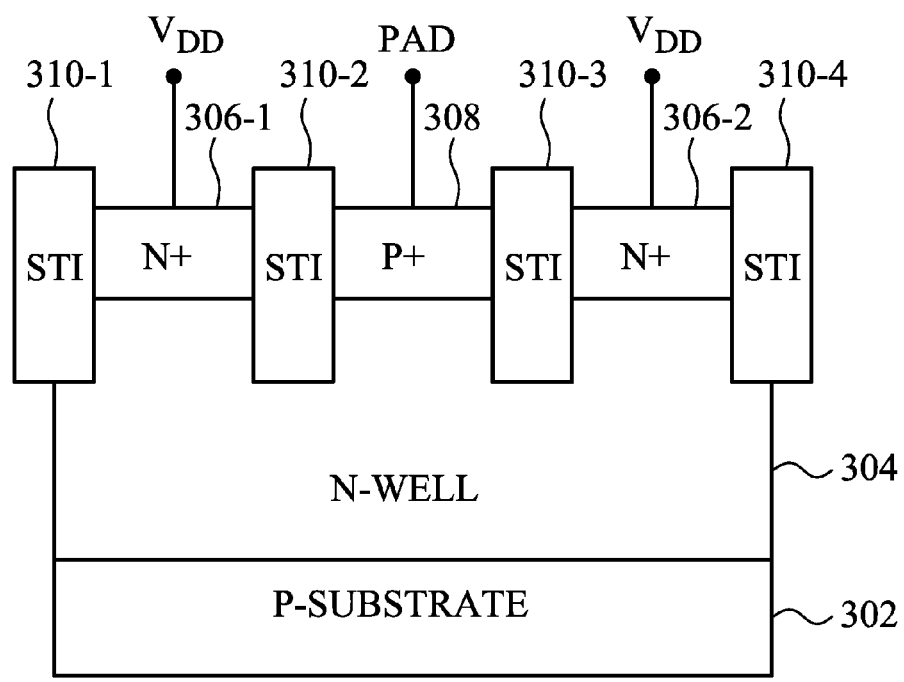
FIG. 3B is a cross-sectional view of the conventional ESD protection device illustrated in FIG. 3A.
Figure 4A:
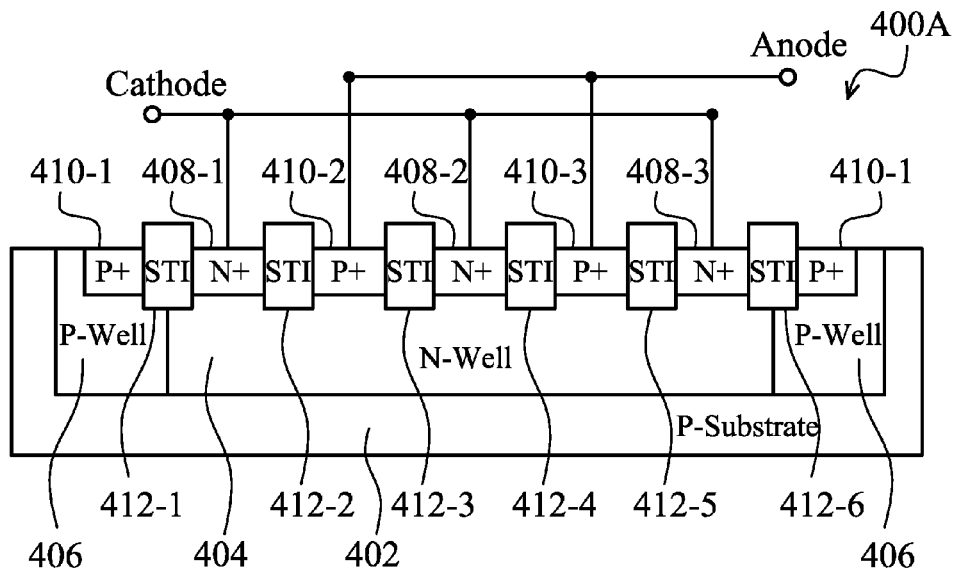
FIG. 4A is a cross-sectional view of an improved ESD protection device.

FIG. 4A is a cross-sectional view of a junction varactor 400A for providing ESD protection in RF applications. As shown in FIG. 4A, junction varactor 400A includes an n-well 404 vertically formed over a p-type substrate 402. A p-well 406 is horizontally disposed adjacent to n-well 404 such that p-well 406 surrounds the sides of n-well 404. Three laterally spaced N+ regions 408-1, 408-2, and 408-3 (collectively referred to as "N+ regions 408") are formed over n-well 404 and are separated by P+ regions 410-2 and 410-3. A P+ region 410-1 is formed over p-well 406. Shallow trench isolation (STI) regions 412-1:412-6 are disposed between each of the adjacent N+ and P+ regions 408, 410-2, and 410-3. P+ regions 410-2 and 410-3 are coupled together to form the multi-finger anode of ESD protection device 400A, and N+ regions 408 are coupled together to provide the multi-finger cathode of the ESD protection device 400A. A second diode is formed by the p-n junction between n-well 404 and the p-type substrate 402, and a third diode is formed by the p-n junction between n-well 404 and p-well 406.

Figure 4B:
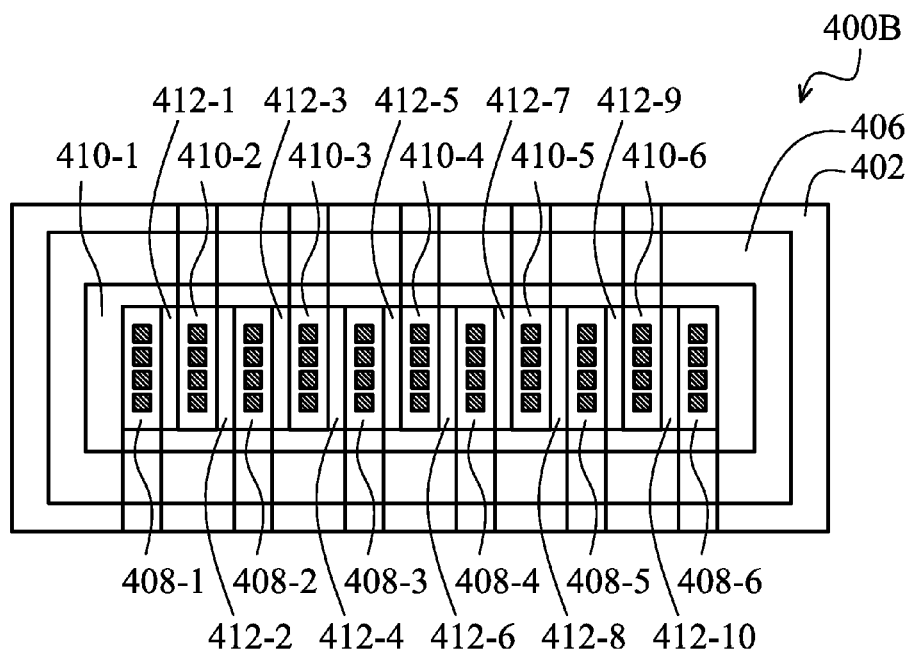
FIG. 4B is a plan view of an improved ESD protection device.

FIG. 4B is a plan view of a junction varactor 400B similar to junction varactor 400A shown in FIG. 4A. Junction varactor 400B includes a p-well 406 formed in p-type semiconductor substrate 402. P-well 406 surrounds n-well 404 (not shown), which has a P+ region 410-1 formed in its upper surface. Six N+ regions 408-1:408-6, each being a respective finger, are formed in an upper surface of n-well 404 and are coupled together to form the cathode of junction varactor 400B. Although junction varactor 400B is shown having six cathode fingers 408-1:408-6, one skilled in the art will understand that junction varactor 400B may be implemented with fewer or more fingers. Five P+ regions 410-2:410-6, each defining a separate finger, are formed in an upper surface of n-well 404 and are coupled together to form the anode of junction varactor 400B. Increasing the number of fingers increases the ability of the junction varactor 400B to handle high currents resulting from ESD events as the chance of electron migration is reduced.

Figure 4C:
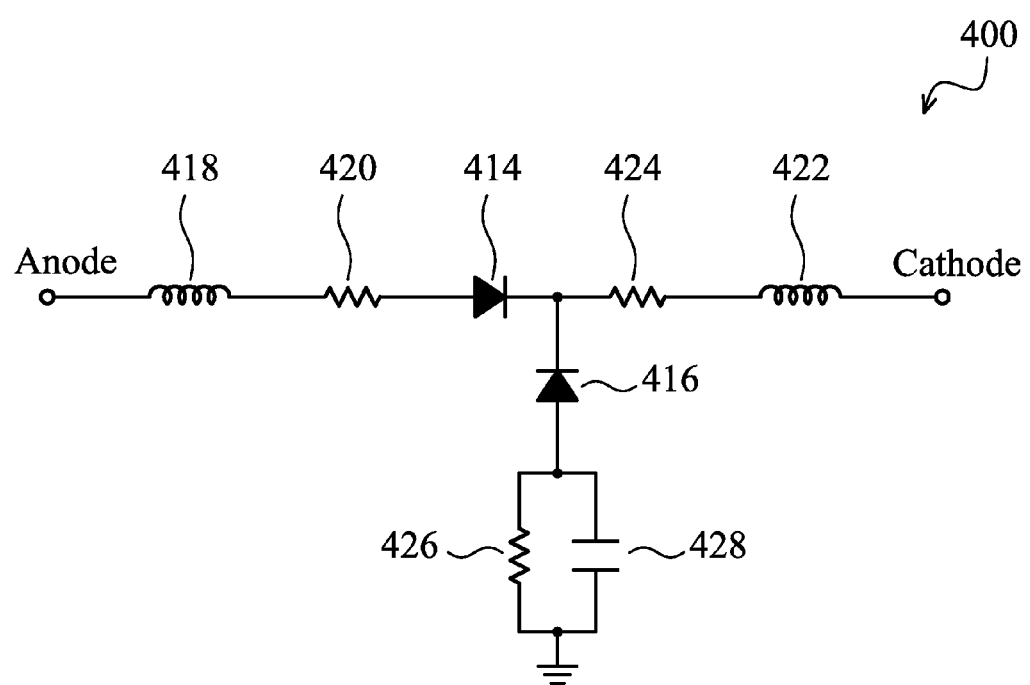
FIG. 4C is one example of an equivalent circuit of the ESD protection devices illustrated in FIGS. 4A and 4B.

FIG. 4C is an equivalent circuit model of the junction varactors 400A and 400B. As shown in FIG. 4C, the lead coupled to the anode of diode 414, which is formed by the p-n junction between P+ regions 410 and n-well 404, has an inductance, represented by inductor 418, and a resistance, represented by resistor 420. Similarly, the lead coupled to the cathode of diode 414 has an inductance and a resistance and are represented by inductor 422 and resistor 424 in FIG. 4C.

Diode 416, which is formed by the p-n junction between n-well 404 and p-type substrate 402, has its cathode coupled to the cathode of diode 414. The anode of diode 416 is coupled to ground or a reference voltage through p-type substrate 402 having a resistance and a capacitance respectively represented by resistor 426 and capacitor 428.

In operation, diode 414 of junction varactor 400 is reverse biased and functions as a capacitor under normal RF operating conditions. Put another way, diodes 414 and 416 are normally in an off state and does not conduct current in the absence of an ESD event. During ESD zapping, diode 414, formed by the interface between P+ regions 410 and n-well 404, is forward biased and acts as a bypass for high ESD current. When a negative pulse is applied with the positive supply voltage, $V_{DD}$, grounded and a negative ESD pulse is applied, i.e., ND mode, then diode 416 is forward biased and acts as a second conduit for ESD current.

Figure 5A:
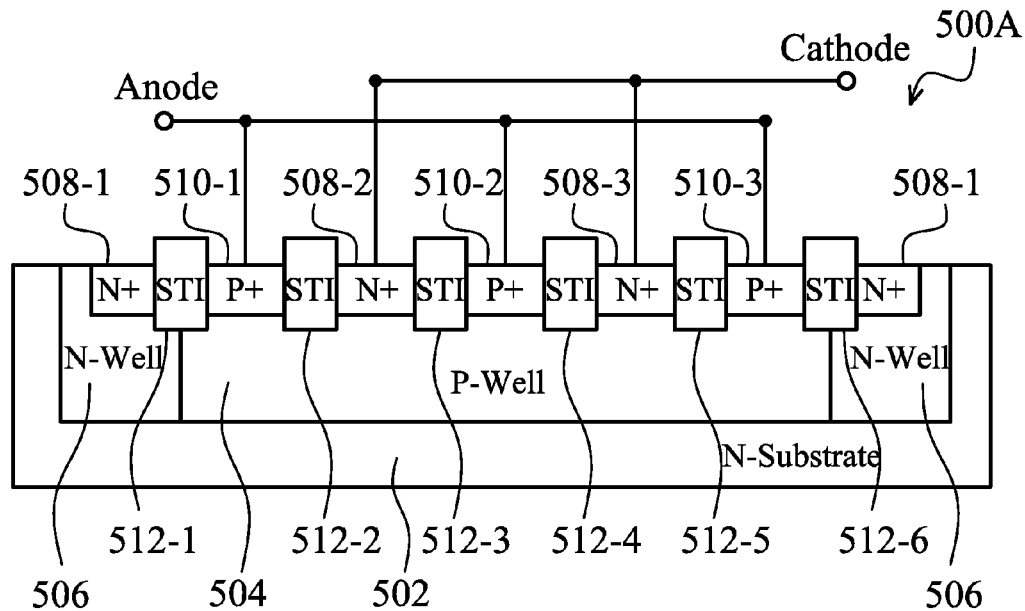
FIG. 5A is a cross-sectional view of another example of an improved ESD protection device.

FIG. 5A is a cross-sectional view of another example of a junction varactor 500A. As shown in FIG. 5A, junction varactor 500A includes a p-well 504 formed over an n-type substrate 502. N-well 506 is horizontally disposed adjacent to, and surrounds the sides of, p-well 504. N+ regions 508-2 and 508-3 are formed in an upper portion of p-well 504, and N+ region 508-1 (together collectively referred to as "N+ regions 508") is formed in an upper surface of n-well 506. P+ regions 510-1, 510-2, and 510-3 (collectively referred to as "P+ regions 510") are disposed between adjacent N+ regions 508 in an upper surface of p-well 504 such that each N+ region 508 is separated by a P+ region 510. STI regions 512-1:512-6 are disposed between adjacent N+ and P+ regions 508, 510. P+ regions 510 form an anode of a first diode of junction varactor 500A, and N+ regions 508-2 and 508-3 form a cathode of the first diode of junction varactor 500A. The p-n junction between the p-well 502 and the n-type substrate 502 form a second diode.

Figure 5B:
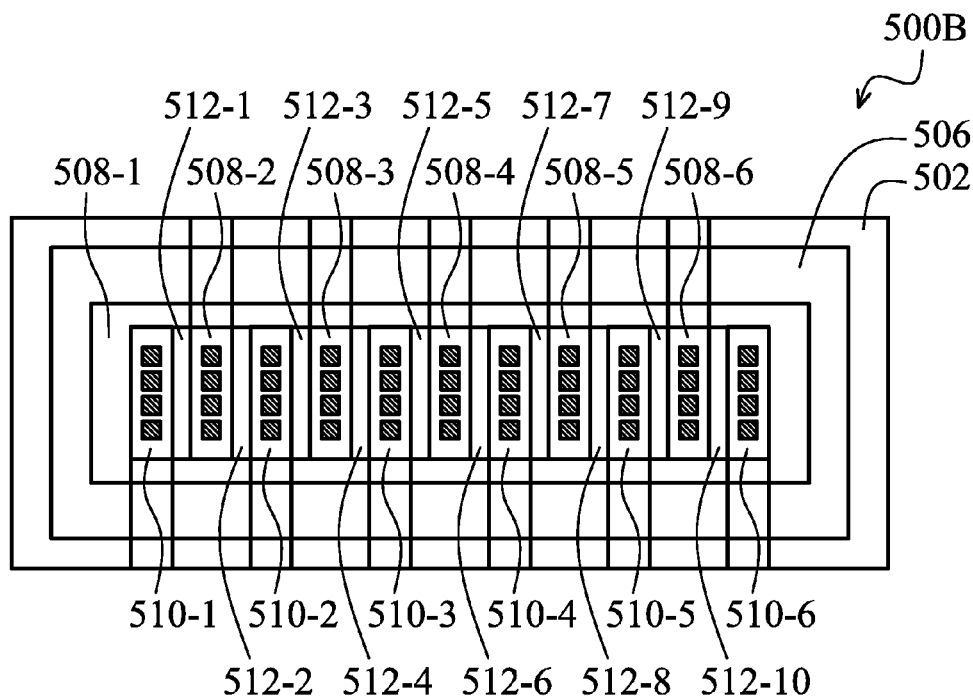
FIG. 5B is a cross-sectional view of another example of an improved ESD protection device.

FIG. 5B is a plan view of another example of a junction varactor 500B for providing ESD protection in RF applications. Junction varactor 500B has a similar structure to junction varactor 400B illustrated in FIG. 4B, except junction varactor 500B is formed over an n-type semiconductor substrate 502 and includes an n-well 506 surrounding a p-well 504, which is not shown. Like items are indicated by the same reference numeral, increased by 100 relative to the corresponding item in FIG. 4B. Redundant descriptions are not repeated for the sake of brevity.

Figure 6:
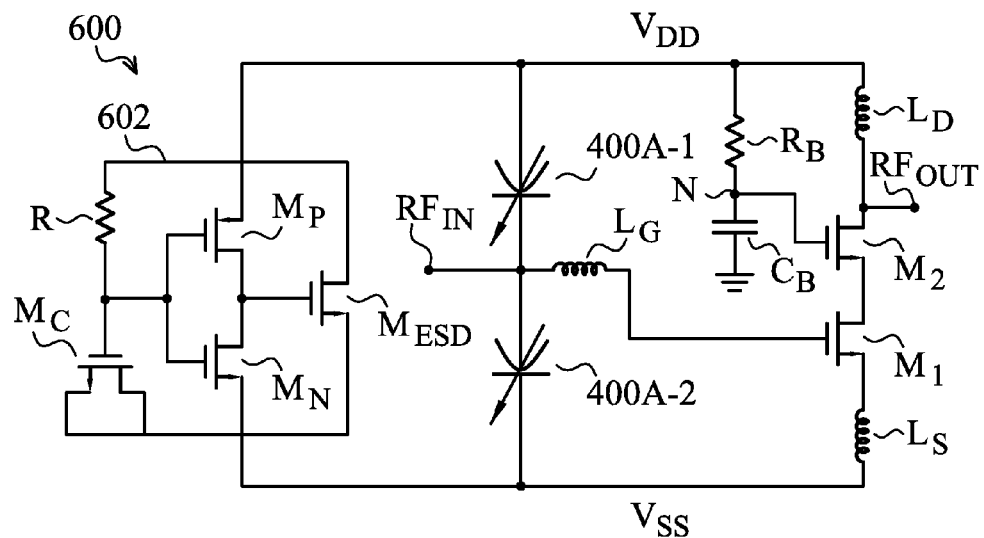
FIG. 6 is a schematic illustration of a radio frequency low-noise amplifier including ESD protection devices in accordance with FIG. 4A.

FIG. 6 is a circuit diagram of a low-noise amplifier (LNA) 600 including a pair of junction varactors 400A-1, 400A-2 configured as ESD protection devices. LNA includes a power clamp 602 for minimizing the voltage drop along the ESD current bypasses provided by junction varactors 400-1, 400-2. Power clamp 602 includes a resistor, R, and multi-finger transistors MN, MP, MESD, and MC. LNA 600 also includes a transistor M1 receiving an RF signal at its gate through gate inductor, Lg. A source inductor, Ls, is coupled between the source of transistor M1 and supply voltage $V_{SS}$. Transistor M2 is coupled to the drain of transistor M1 and has its drain coupled to supply voltage $V_{DD}$ through a drain inductor, Ld. The gate of transistor M2 is coupled to a node, N, disposed between a biasing resistor, Rb, which is coupled to $V_{DD}$, and a biasing capacitor, $C_b$, which is coupled to ground. Junction varactor 400A-1 has its cathode coupled to $V_{DD}$ and its anode coupled to the RF input node, $RF_{IN}$. Junction varactor 400A-2 has its cathode coupled to RF input node, $RF_{IN}$, and its anode coupled to $V_{SS}$. Although this example of an LNA includes the junction varactor of FIG. 4A, other examples of LNAs can include other embodiments of the junction varactor.

A 5.8 GHz LNA in accordance with LNA 600 was designed and tested. The LNA was fabricated in a 0.18 µm RF CMOS process and showed a low-noise figure of approximately 2.8 dB and a high-power gain of approximately 20.1 dB. Varactors 400A-1, 400A-2 had widths of approximately 2 µm, lengths of approximately, 0.42 µm, 36 fingers, and capacitances of approximately 73 fF. A human-body model (HBM) test of 2 kV, i.e., a current of 1.34 A, was performed. The transmission line pulse (TLP) test setup featured a rising time of 10 ns and a pulse width of 100 ns corresponding to the HBM ESD test model. The HBM ESD protection level was estimated as $V_{ESD}=1.5$ k$\Omega \times I_{t2}$.

Figure 7:
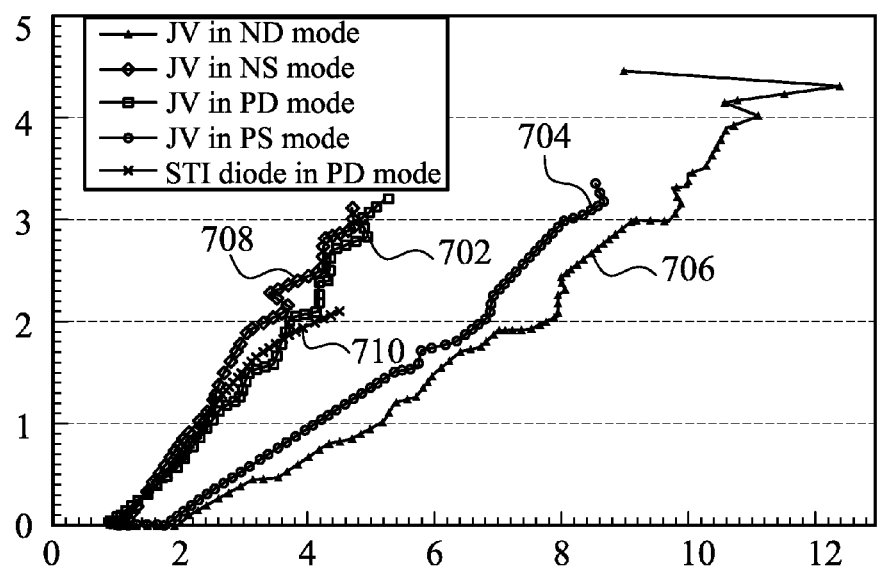
FIG. 7 is a current versus voltage graph illustrating the current leakage of a junction varactor used as an RF ESD device in a low-noise amplifier in accordance with FIG. 6.

FIG. 7 illustrates the test results of the TLP. Trace 702 illustrates the test results for PD mode (positive pulse with $V_{DD}$ grounded), trace 704 illustrates the test results for PS mode (positive pulse with $V_{SS}$ grounded), trace 706 illustrates the test results for ND mode, and trace 708 illustrates the test results for NS modes (negative pulse with $V_{SS}$ grounded). As shown in FIG. 7, the TLP results for the PD, PS, and NS modes resulted in a TLP current of approximately 3 A, which corresponds to a 4.5 kV HBM ESD level. The ND mode resulted in a higher $I_{t2}$ measurement of approximately 4.34 A, which corresponds to a 6.5 kV HBM ESD level. The higher HBM ESD performance in ND mode is attributed to diode 416 turning on during the ESD event to act a second conduit for ESD current. For comparison purposes, FIG. 7 also includes trace 710, which shows the TLP I-V curve of an STI diode fabricated in 0.18 µm technology, such as the diode disclosed in "A Low Noise Amplifier Co-designed with ESD Protection Circuit in 65-nm CMOS" by Tsai et al., IEEE MTT-S Int. Microwave Symp., pp. 573-576, Boston, June, 2009, the entirety of which is herein incorporated by reference. As shown in FIG. 7, the $I_{t2}$ measurement for the STI diode was approximately 2 A, which corresponds to a 3 kV HBM ESD level.

Table I, below, provides a summary of the RF performance of the LNA 600 including the junction varactors 400A-1, 400A-2 implemented as ESD protection devices. NF is the noise figure and is measured by a power spectrum analyzer (PSA); $P_{DC}$ is the DC power consumption; $S_{11}$ is the input return loss; and IIP3 is the third-order inter-modulation point measured from a two-tone test by a PSA.

TABLE I

| | Frequency (GHz) | NF (dB) | $P_{DC}$ (mW) | GAIN (dB) | $S_{11}$ (dB) | IIP3 (dBm) | HBM (kV) |
|---|---|---|---|---|---|---|---|
| ESD-Protected LNA | 5.8 | 2.8 | 14.9 | 20.1 | −10.6 | −8.87 | 4.5/6.5 |

Accordingly, the distributed multi-finger junction varactor described herein demonstrated enhanced ESD protection compared to conventional single-finger STI diodes. Additionally, the distributed multi-finger junction varactors provide a large perimeter-to-area ratio enabling multiple metal layers for interconnections to the anode and cathode to sustain high ESD current without suffering from electron-migration.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A electrostatic discharge (ESD) protection device, comprising:
    a substrate of a first semiconductor type;
    a first well of a second semiconductor type formed in the substrate;
    a first plurality of elongate laterally spaced doped regions of the first semiconductor type formed in an upper surface of the first well, the first plurality of laterally spaced doped regions coupled together to define an anode of the ESD protection device;
    a second plurality of elongate laterally spaced doped regions of the second semiconductor type formed in the upper surface of the first well, the second plurality of laterally spaced doped regions coupled together to define a cathode of the ESD protection device; and
    a plurality of shallow trench isolation (STI) regions disposed in an upper surface of the first well, each of the plurality of STI regions disposed between an elongate laterally spaced doped region of the first semiconductor type and a second elongate laterally spaced doped region of the second semiconductor type,
    wherein each of the first and second pluralities of laterally spaced doped regions have respective lengths that extend in a first direction that is orthogonal to a second direction in which the first and second pluralities of doped regions extend laterally and have respective widths that extend parallel to the second direction,
    wherein the ESD protection device has a length that extends in the second direction and that is greater than a width that extends in the first direction, and
    wherein a diode defined by the first well and the first plurality of laterally spaced doped regions of the first semiconductor type is configured to operate as a passive radio frequency capacitor when reverse biased and to be forward biased to provide a current bypass when an ESD voltage spike is received at one of the anode or the cathode.

2. The ESD protection device of claim 1, wherein the first semiconductor type is a p-type, and the second semiconductor type is an n-type.

3. The ESD protection device of claim 1, wherein a diode defined by the first well and the substrate is configured to be forward biased when the ESD voltage spike is received at one of the diode or the cathode.

4. The ESD protection device of claim 1, further comprising a second well of the first semiconductor type formed in the substrate and surrounding the first well of the second semiconductor type.

5. The ESD protection device of claim 4, wherein the second well of the first semiconductor type and the first well of the second semiconductor type define a diode for providing a second current bypass when the ESD voltage spike is received at one of the diode or the cathode.

6. The ESD protection device of claim 1, wherein the anode of the ESD protection device is coupled to an input node of a low-noise amplifier for receiving an RF input signal, and the cathode of the ESD protection device is coupled to a positive voltage supply node of the low-noise amplifier.

7. The ESD protection device of claim 6, wherein the input node is coupled to a gate of a first transistor, the first transistor having a source coupled to a negative voltage supply node and a drain coupled to a source of a second transistor, the second transistor having a drain coupled to an output node of the low-noise amplifier and to the positive voltage supply node.

8. The ESD protection device of claim 7, wherein the low-noise amplifier includes a power clamp coupled in parallel with the first and second transistors, the power clamp including a plurality of transistors.

9. A radio frequency (RF) electrostatic discharge (ESD) protection device, comprising:
a first well of a second semiconductor type formed in a substrate of a first semiconductor type;
a second well of the first semiconductor type formed in the substrate and surrounding the first well;
a first plurality of elongate laterally spaced doped regions of the first semiconductor type formed in an upper surface of the first well, the first plurality of doped regions coupled together to form an anode of the ESD protection device;
a second plurality of elongate laterally spaced doped regions of the second semiconductor type formed in the upper surface of the well, the second plurality of doped regions coupled together to form a cathode of the ESD protection device; and
a plurality of shallow trench isolation (STI) regions disposed in an upper surface of the first well, each of the plurality of STI regions disposed between one of the elongate laterally spaced doped regions of the first semiconductor type and one of the elongate laterally spaced doped region of the second semiconductor type,
wherein each of the first and second pluralities of laterally spaced doped regions have respective lengths that extend in a first direction that is orthogonal to a second direction in which the first and second pluralities of doped regions extend laterally and have respective widths that extend parallel to the second direction,
wherein the RF ESD protection device has a length that extends in the second direction and that is greater than a width that extends in the first direction, and
wherein the first well and the plurality of elongate laterally spaced doped regions of the first semiconductor type form a first diode configured to operate as a passive radio frequency capacitor when reverse biased and to be forward biased to provide a current bypass when an ESD voltage spike is received at one of the anode or the cathode.

10. The RF ESD protection device of claim 9, wherein the first and second wells form a second diode configured to provide a second current bypass when an ESD voltage spike is received at one of the anode or the cathode.

11. The RF ESD protection device of claim 10, wherein the first well and the substrate form a third diode configured to provide a third current bypass when an ESD voltage spike is received at one of the anode or the cathode.

12. The RF ESD protection device of claim 9, wherein the second semiconductor type is an n-type and the first semiconductor type is a p-type.

13. An electrostatic discharge (ESD) protection device for radio frequency circuits, comprising:
a first well of a first semiconductor type formed in a substrate of a second semiconductor type, the first well and the substrate forming a first diode;
a second well of the second semiconductor type formed in the substrate adjacent to the first well, the second well forming a second diode with the first well;
a first plurality of elongate laterally spaced doped regions of the first semiconductor type formed in an upper surface of the first well;
a second plurality of elongate laterally spaced doped regions of the second semiconductor type formed in the upper surface of the first well to form a third diode with the first well;
a plurality of shallow trench isolation (STI) regions formed in the upper surface of the first well, each of the STI regions disposed between one of the doped regions of the first semiconductor type and one of the doped regions of the second semiconductor type,
wherein each of the first and second pluralities of laterally spaced doped regions have respective lengths that extend in a first direction that is orthogonal to a second direction in which the first and second pluralities of doped regions extend laterally and have respective widths that extend parallel to the second direction,
wherein the ESD protection device has a length that extends in the second direction and that is greater than a width that extends in the first direction, and
wherein the third diode is configured to be forward biased to provide a current bypass when an ESD voltage spike is received at one of the first plurality of elongate laterally spaced doped regions of the first semiconductor type or the second plurality of elongate laterally spaced doped regions of the second semiconductor type.

14. The ESD protection device of claim 13, wherein the first semiconductor type is an n-type and the second semiconductor type is a p-type.

15. The ESD protection device of claim 14, wherein the plurality of elongate laterally spaced doped regions of the first semiconductor type are coupled together to form the cathode of the ESD protection device.

16. The ESD protection device of claim 15, wherein the plurality of elongate laterally spaced doped regions of the second semiconductor type are coupled together to form the anode of the ESD protection device.

17. The ESD protection device of claim 16, wherein the anode of the ESD protection device is coupled to an input node of a low-noise amplifier for receiving an RF input signal and the cathode of the ESD protection device is coupled to a positive voltage supply node of the low-noise amplifier.

18. The ESD protection device of claim 13, wherein the first semiconductor type is a p-type and the second semiconductor type is an n-type.

19. The ESD protection device of claim 18, wherein the plurality of elongate laterally spaced doped regions of the first semiconductor type are coupled together to form the anode of the ESD protection device.

20. The ESD protection device of claim 19, wherein the plurality of elongate laterally spaced doped regions of the second semiconductor type are coupled together to form the cathode of the ESD protection device.

* * * * *